United States Patent

Sjödin et al.

[11] Patent Number: 6,153,919
[45] Date of Patent: Nov. 28, 2000

[54] BIPOLAR TRANSISTOR WITH POLYSILICON DUMMY EMITTER

[75] Inventors: Håkan Sjödin, Knivsta; Anders Söderbärg, Uppsala; Nils Ögren, Vällingby; Ivar Hamberg, Stockholm; Dimitri Olofsson, Danderyd; Karin Andersson, Hässelby, all of Sweden

[73] Assignee: Telefonaktiebolaget LM Ericsson, Stockholm, Sweden

[21] Appl. No.: 09/236,619

[22] Filed: Jan. 26, 1999

Related U.S. Application Data

[62] Division of application No. 09/033,714, Mar. 3, 1998.

[30] Foreign Application Priority Data

Mar. 4, 1997 [SE] Sweden .................. 9700773

[51] Int. Cl.⁷ .................................................. H01L 29/00
[52] U.S. Cl. .......................... 257/558; 257/559; 257/557; 438/321
[58] Field of Search ...................... 257/557, 558, 257/565, 559; 438/321

[56] References Cited

U.S. PATENT DOCUMENTS

| | | |
|---|---|---|
| 4,451,844 | 5/1984 | Komatsu et al. . |
| 4,745,080 | 5/1988 | Scovell et al. . |
| 5,279,978 | 1/1994 | See et al. . |
| 5,406,113 | 4/1995 | Horie . |
| 5,451,532 | 9/1995 | Bashir et al. . |
| 5,666,001 | 9/1997 | Miwa ...................................... 257/592 |
| 5,708,287 | 1/1998 | Nakagawa et al. ...................... 257/350 |

FOREIGN PATENT DOCUMENTS

| | | |
|---|---|---|
| 0 034 508 A1 | 8/1981 | European Pat. Off. . |
| 0 122 004 A2 | 10/1984 | European Pat. Off. . |
| 93/06622 | 4/1993 | WIPO . |

*Primary Examiner*—Donald L. Monin, Jr.
*Assistant Examiner*—Ginette Peralta
*Attorney, Agent, or Firm*—Nixon & Vanderhye P.C.

[57] ABSTRACT

A manufacturing method for semiconductor components is disclosed which will allow better precision in the definition of the doped areas of the components and the separation of differently doped areas. A selectively shaped area of, for example, polysilicon, defining the area or areas to be doped, is deposited on the component before the masks are applied. This makes the fitting of the masks less critical, as they only have to be fitted within the area of the polysilicon layer. In this way an accuracy of 0.1 μm or better can be achieved.

5 Claims, 6 Drawing Sheets

BIPOLAR TRANSISTOR WITH POLYSILICON DUMMY EMITTER

This is a division of application Ser. No. 09/033,714, filed Mar. 3, 1998, now pending.

TECHNICAL FIELD

The present invention relates to a manufacturing method for semiconductors.

BACKGROUND

In silicon components, aluminium is often used as contacts to, for example, the base and the emitter. This has the following disadvantages:

Aluminium spiking may occur through thin pn junctions, resulting in short circuits. If pure aluminium is used, silicon from the surface can diffuse into the aluminium, leaving voids or non-homogenous regions below the aluminium contact. If an alloy of aluminium with silicon is used the silicon can be deposited in the contact areas in form of precipitates causing high contact resistance.

To avoid the above mentioned disadvantages which occur when aluminium comes in direct contact with silicon, a barrier layer, for example of TiW, is normally used between the silicon layer and the aluminium. In this case both n type and p type silicon must be doped under the contact surfaces to achieve low contact resistance. To avoid avalanche breakdown between n+ and p+ areas at low voltages, they need to be separated. The distance by which they are separated is important for the characteristics of the component. The separation can be accomplished in several ways. One common way is to implant the dopants through two individual masking layers. The second mask must be aligned to the first mask. Uncertainties in this alignment will always cause some lateral error between the layers.

If the component is to be doped both with acceptors and donors, as is the case with practically all semiconductors, the process of masking must be carried out twice: once masking out the parts which should not be exposed to acceptors before doping with the p dopant, and once masking out the parts which should not be exposed to donors before doping with the n dopant. Also, the masks must be dimensioned and applied very carefully to achieve doping of exactly the desired areas. There is also a risk that the dopant will not be completely restricted to the unprotected areas.

U.S. Pat. No. 4,451,844 discloses a semiconductor device manufactured using a layer of polycrystalline silicone (polysilicon) to cover the active area of the component. The masks used for covering parts of the component while doping are applied on top of the polysilicon, and the component is doped through the layer of polysilicon.

U.S. Pat. No. 5,451,532 describes a process for making a bipolar transistor in which a polysilicon layer is used both as an emitter, which raises above the surface of the transistor, and, together with sidewall spacings, as a mask when doping the base contact, which is placed around the emitter.

SUMMARY OF THE INVENTION

Thus, it is an object of the invention to obtain a method for separation of the n+ and p+ areas in a semiconductor with high accuracy.

It is another object of the invention to achieve a high accuracy in the distance between of the n+ and p+ areas with very small distances.

It is yet another object of the invention to obtain a high area accuracy of the area surrounded by the polysilicon area.

It is yet another object of the present invention to obtain a method for doping both n+ and p+ areas of semiconductor components without the need for two separate masks.

The above mentioned objects are achieved according to the present invention by depositing at least one selectively shaped area (11'; 11") of a material or combination of materials, that can be defined with high accuracy, so thick that it will not be penetrated by dopant ions, on the component to delimit the doped area or areas before the doping of the component is carried out using conventional masking techniques.

The material used may be polycrystalline silicon (polysilicon), silicon nitride $Si_3N_4$, or a silicide, such as $TiSi_x$, $CoSi_x$ or $WSi_x$. It may also be a combination of any of these and/or an oxide.

The invention has the following advantages:

It is possible to separate the n+ and p+ areas by a very small distance with an accuracy better than 0,1 µm without additional masking steps in the manufacturing process.

The $SiO_2$ area covering the component underneath the polysilicon area provides a surface of high quality, with a minimum number of crystal defects and surface states causing leakage currents.

If the preceding processing of the component involves depositing a polysilicon layer, one masking step less is required in the method according to the invention compared to prior art methods. This is particularly useful in BiCMOS processes, that is, when MOS components and bipolar components are used together.

BRIEF DESCRIPTION OF THE DRAWINGS

The invention will be described in more detail in the following, with particular reference to the drawings, on which.

DETAILED DESCRIPTION OF EMBODIMENTS

Figure 1:
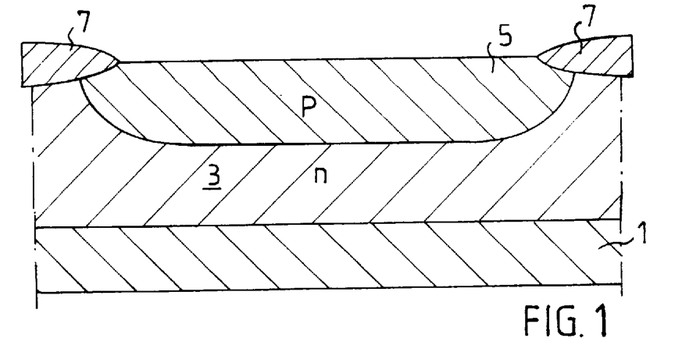
FIG. 1 is a cross-section of a part of a silicon component ready to be processed according to the invention.

FIG. 1 shows a part of the silicon component ready to be processed according to the invention. The base area and part of the collector area are shown. On a first layer 1 of carrier substrate, which may be, for example, a silicon layer with some kind of doping or an insulator, there is a layer 3 of n type silicon, forming part of the collector area. The n type silicon is just an example, and it will be readily understood that the method can be applied to p type silicon as well, in which case the areas which are here p+ doped will be n+ doped and vice versa.

An area 5, which is the base area and has the opposite doping from the collector area 3, is delimited by an oxidized area 7 covering the surface of the component in an area around the base area.

To this component, first a layer of $SiO_2$ is applied either by oxidizing the surface by means of heat treatment in an oxidizing atmosphere, or covering the component with a layer of $SiO_2$. Then a layer of polysilicon is applied on top of the $SiO_2$ layer. In the described embodiments, polysilicon is used. As mentioned above, other material, such as silicon nitride, a silicide or a combination of nitride, polysilicon, silicide and/or oxide could be used instead.

Figure 2A:
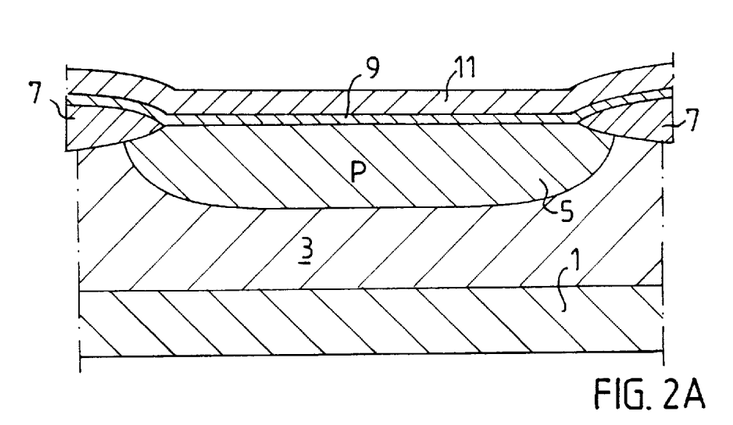
FIGS. 2A to 2F show different stages in the process of manufacturing a component according to a first embodiment of the invention, the component shown in cross section.

FIG. 2A shows the upper part of the silicon component after these two steps have been carried out. A layer 9 of $SiO_2$ covers the component over the entire active area 5, and a layer 11 of polysilicon covers the $SiO_2$ layer 9.

The polysilicon layer 11 is then doped to decrease the resistivity of the layer. Then it is oxidized to create a protection layer for further process steps, and the dopant used is activated.

Next, the polysilicon layer 11 and the $SiO_2$ layer 9 are to be etched back, except where it will be used in the process to follow. This is done by masking out the areas to be kept, using masking techniques well known to the person skilled in the art. First the component is oxidized again so that an $SiO_2$ layer forms on top of the component, then the mask is applied.

Figure 2B:
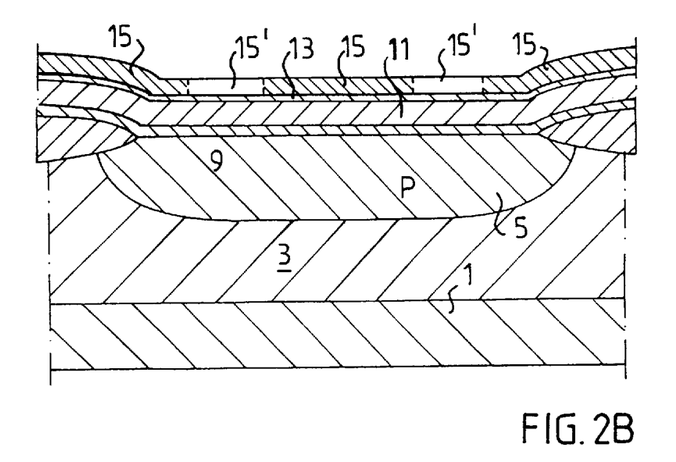

FIG. 2B shows the component at this stage. On the active area of the component, one or more areas are covered by a first layer 9 of $SiO_2$, a layer 11 of polysilicon, a second layer 13 of $SiO_2$ and a layer 15 of the substance used to mask out the area. Two parts 15' have been treated so that they will not be etched back in the first process, thus masking out the areas of the component on which the polysilicon layer 11 will remain.

Figure 2C:
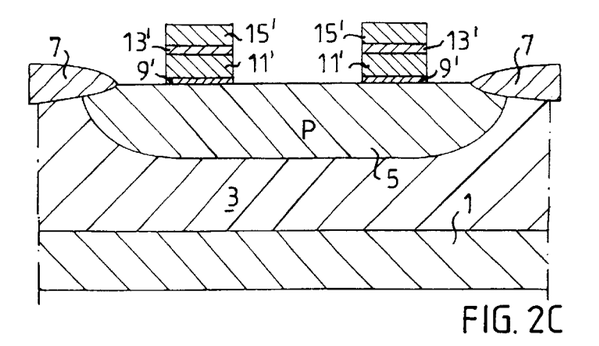

FIG. 2C shows the situation after the covering layers 9, 11, 13, 15 have been etched back. In the selected areas, the component is covered with one layer 9' of $SiO_2$, a polysilicon layer 11' on top of that, then another layer 13' of $SiO_2$ and then the mask layer 15'.

Figure 2D:
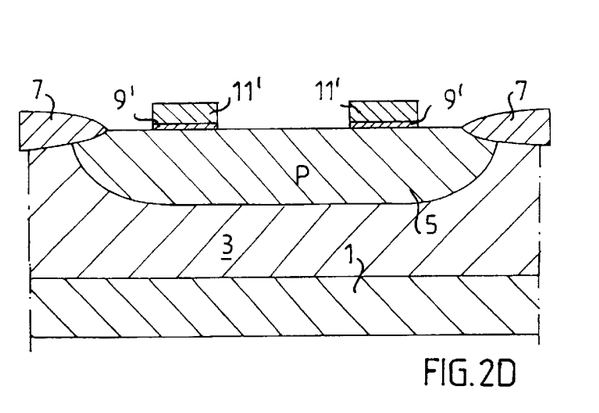

Next, the mask layer 15' and the $SiO_2$ layer 13' are removed using techniques well known to the person skilled in the art. As shown in FIG. 2D, the resulting component is covered in the selected areas with one layer 9' of $SiO_2$ and one layer 11' of polysilicon.

Figure 2E:
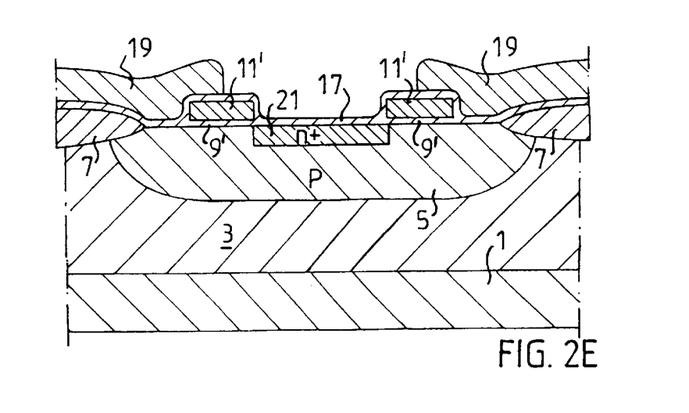

The surface is oxidized, resulting in a thin oxidized layer 17 shown in FIG. 2E. The layer 17 must be so thin that the dopant will reach through it to dope the component. The thickness of the oxide layer 17 depends on the kind of dopant used and the energy with which the dopant ions are implanted. Typical values are 150–500 Å. A mask 19 defining an emitter area 21 has been applied and the component is ready for doping with an n+ dopant to form the emitter 21. As can be seen in FIG. 2E, this mask does not have to be fitted exactly to the emitter area 21, but only has to be fitted to some part of the upper surface of the polysilicon layer 11'. The mask 19 and the polysilicon layer 11' ensure that only the emitter area 21 is doped.

Figure 2F:
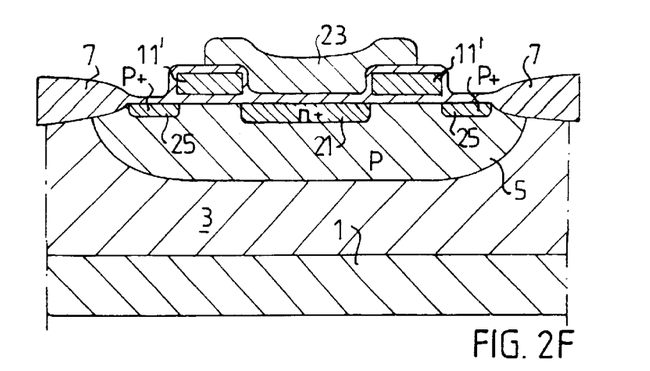

The next step is to remove the mask 19. Then a new mask 23 is applied to cover the emitter 21 as shown in FIG. 2F. It may be seen that this mask also does not have to be fitted exactly. The component is then exposed to a p+ dopant. The result is the doping of p+ in the areas not covered by the mask 23, the polysilicon layer 11' or by the oxide layer 7, which delimits the active area of the component.

The mask 23 and the oxide layer 17 are then removed. If desirable, of course the polysilicon layer may also be removed.

Figure 2G:
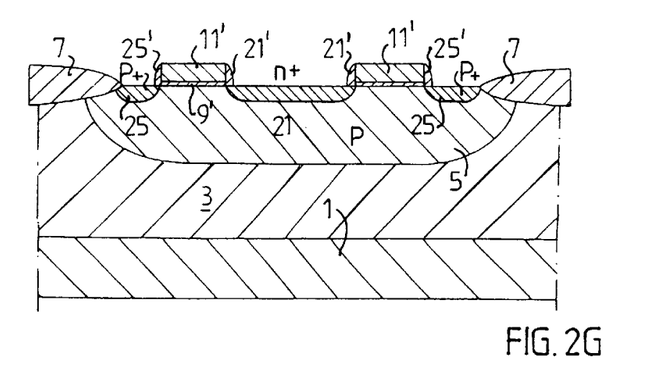
FIG. 2G shows the component in cross-section, after it has been processed according to the first embodiment of the invention, ready for further processing according to known methods.

FIG. 2G shows a cross-section of the resulting component. A p area 5 in the silicon component is delimited by the oxide layer 7. The component as shown has one n+ doped emitter area 21 and one, ring shaped p+ doped base area 25. The n+ doped area 21 and the p+ doped area 25 are separated by the polysilicon area 11', which in this case is ring-shaped. Remaining parts 21', 25' of $SiO_2$ may be found on the sides of the polysilicon line 11'. These parts 21' and 25' will be n+ doped and p+ doped respectively. However, this will not affect the performance of the component.

It is possible to simplify the above process by reducing the number of mask layers required in the process, in the following way: The first steps of the process are the same as described for FIGS. 2A to 2D.

Figure 3A:
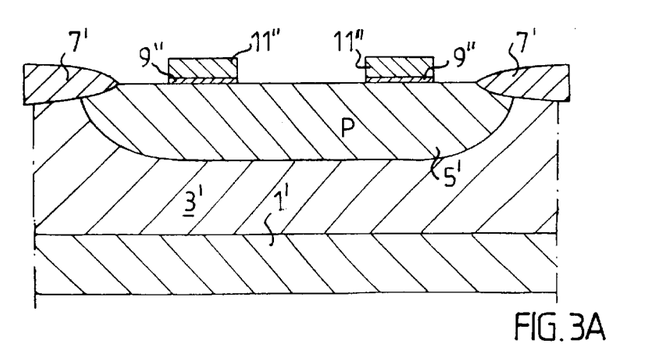
FIGS. 3A to 3E show different stages in the process of manufacturing a component according to a second embodiment of the invention.

FIG. 3A shows the same situation as in FIG. 2D. On a first layer 1', of a carrier substrate which may be, for example, a silicon layer with some kind of doping or an insulator, there is a layer 3' of n type silicon, forming part of the collector area. The n type silicon is just an example, and it will be readily understood that the method can be applied to p type silicon as well. An area 5', which is the base area and the opposite doping of the collector area 3', is delimited by an oxidized area 7' covering the surface of the component.

Figure 3B:
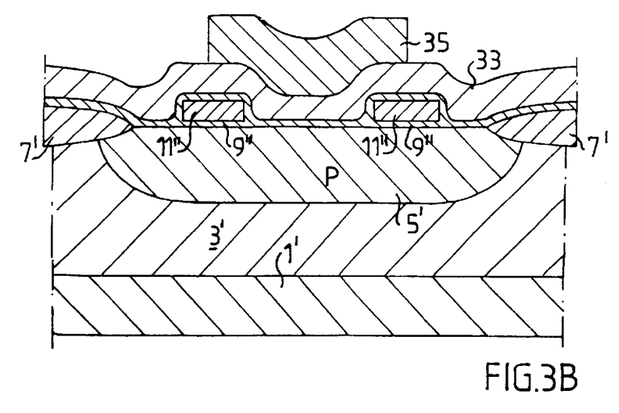

One or more areas of $SiO_2$ 9" and polysilicon 11" cover part of the base area 5'. Next, an thin protective $SiO_2$ layer 31 is deposited or oxidized on the component. as shown in FIG. 3B. Then the device is covered by a second protective layer 33, for example $Si_3N_4$, which can protect the underlying silicon from oxidation. Using a masking layer 35, the second protective layer 33 is removed from the parts of the device which should be oxidized in future steps.

Figure 3C:
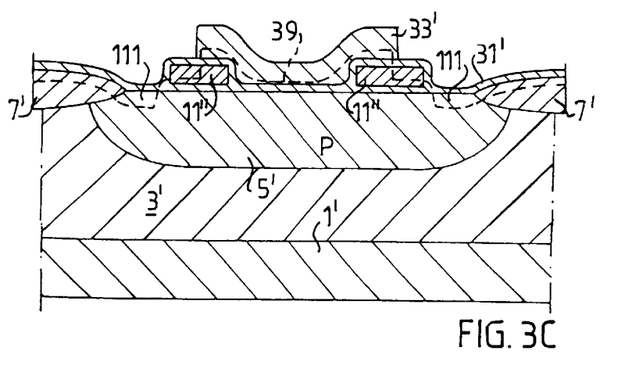

Then the mask layer is removed to produce the component as shown in FIG. 3C. The component is entirely covered by a thin oxide layer 31, and parts of the component are covered by the remaining part of the second protective layer 33'. The next step is to implant the selected dopant, in this case an p+ dopant, by ion implantation, so that the areas that are not protected by the second protective layer 33' will be doped. The ions will penetrate each layers to a certain extent, so that the component will be doped down to a certain level, shown as a dotted line 39. As a result, the areas of the silicon component not covered by the second protective layer 33' or by the field oxide layers 7' will be doped with an p+ dopant.

Figure 3D:
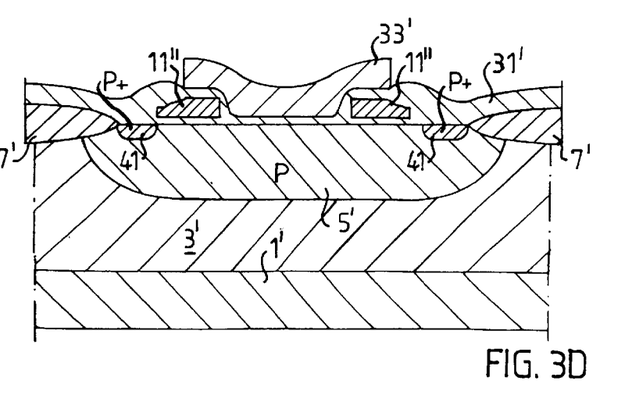

Then the component is oxidized, and the p+ dopant is activated. The areas covered by the second protective layer 33' will not be oxidized. As shown in FIG. 3D, the oxide layer 31' is thicker than the layer 31 in FIG. 3C, except where the component is covered by the second protective layer 33'. The oxide layer 31' must now be so thick that the dopant will not be able to penetrate it completely, that is, it must protect the component from being doped in the areas covered by the oxide layer 31'. The polysilicon areas 11' are partly oxidized and therefore obtain an irregular shape.

Figure 3E:
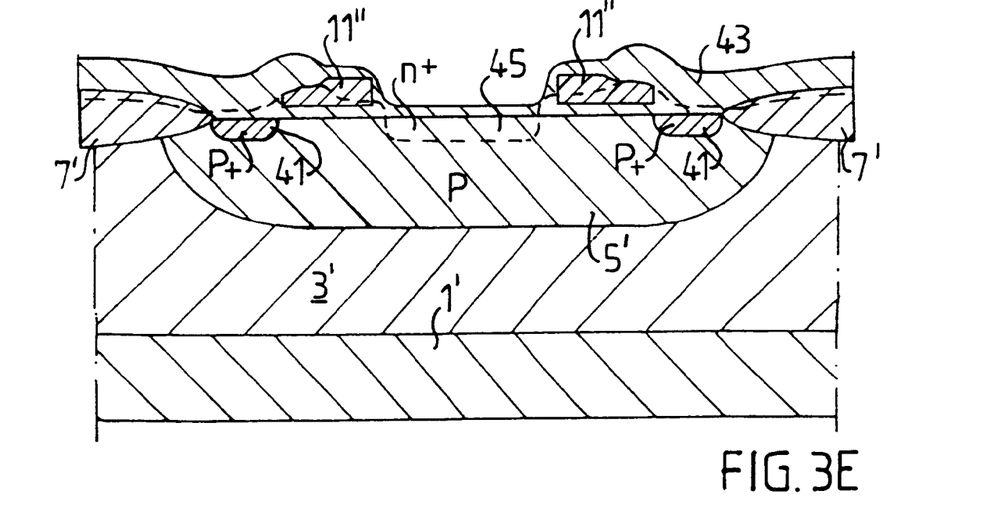

Next, the second protective layer 3' is removed. As shown in FIG. 3E, the $SiO_2$ layer 31' is now so thick that the a new dopant will not be able to penetrate it, except in those areas where the second protective layer 33' prevented further oxidation. The component is then doped with an n+ dopant, which will penetrate all layers to a certain extent, shown with a dotted line 43. Hence, only the area 45 which was covered by the second protective layer 33' will be n+ doped.

Figure 3F:
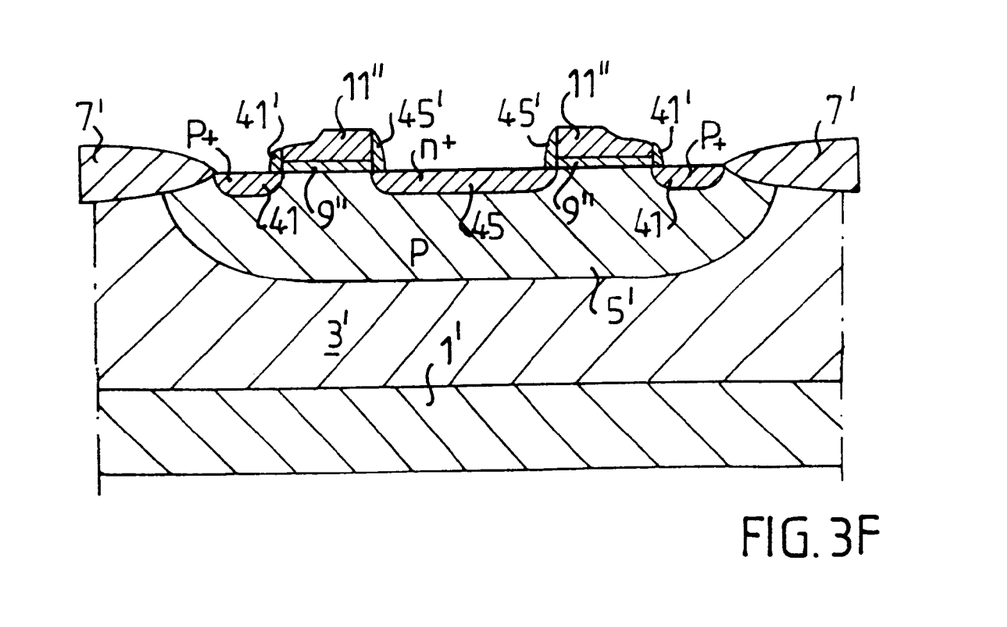
FIG. 3F shows the component in cross-section, after it has been processed according to the second embodiment of the invention, ready for further processing according to known methods.

In a final step, the oxide layer can be removed, to produce the component as shown in FIG. 3F. An p+ doped base area 41 and an n+ doped emitter area 45 are separated by a line of polysilicon 11". On the edges of the polysilicon line 11" some SiO2 41', 45' remains. These areas are doped with the same dopant as the adjacent areas 41 and 45 respectively and, as in FIG. 2G, will not affect the characteristics of the component.

Subsequently, the component is processed according to known methods, to produce the final semiconductor component.

Figure 4:
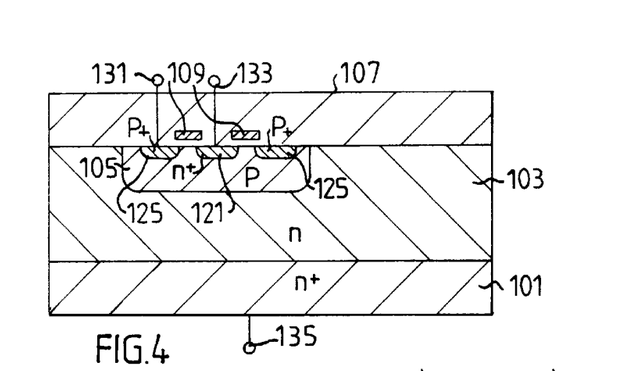
FIG. 4 is a schematic cross-sectional view of a resulting component according to an embodiment of the invention.

FIG. 4 is a schematic representation of cross-sectional view of a component after the final processing. The layout of the component is chosen only as an example; it could be any kind of bipolar component. This kind of component is normally used for vertical bipolar components, for example if no galvanic insulation from the surrounding components is needed. A carrier layer 101 consists of a semiconductor, such as silicon, doped with the same kind of dopant as an adjacent layer 103, but: to a different, normally higher, degree. In the adjacent layer 103, which constitutes the collector area of the component, there is an area 105 with the opposite type of doping which constitutes the base area.

The whole component is covered by an insulating layer 107, which may be a 0.5–3 μm thick layer of oxide. In the base area 105, there is an emitter 121 and a base 125, separated by a polysilicon area 109 on the surface. There is a first contact 131 to the base 125, a second contact 133 to the emitter 121 and a third contact 135 to the collector 103. All contacts are only shown schematically. The contacts can be made using standard techniques for semiconductor device manufacturing, including steps such as deposition and etching of metals and insulating materials.

Figure 5:
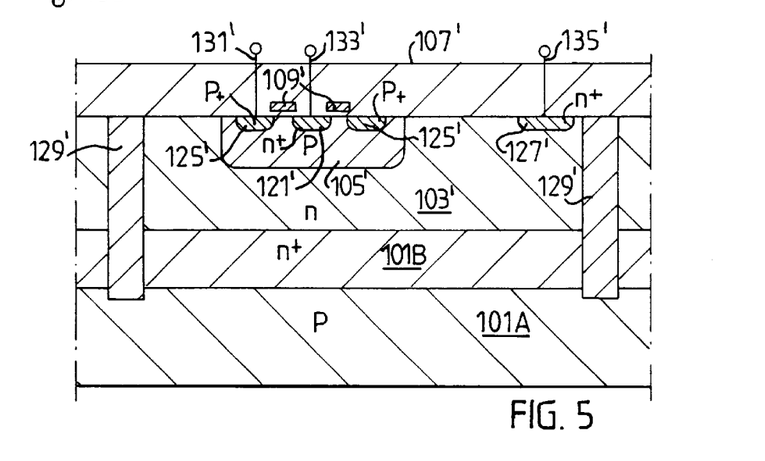
FIG. 5 is a schematic cross-sectional view of a resulting component according to another embodiment of the invention.

FIG. 5 is a schematic representation of cross-sectional view of a component after the final processing. This type of component is used when the component must be electrically separated from surrounding components on the same chip. The layout of the component is chosen only as an example; it could be any kind of bipolar component. A lower carrier layer 101A, consists of a semiconductor, such as silicon, doped with the opposite kind of dopant than an adjacent layer 103' which constitutes the collector area of the component. An upper carrier layer 101B may be situated between the lower carrier layer 101A and the collector layer 103'. If present, the upper carrier layer 101B is doped with the same type of dopant as the collector layer 103', but to a different, normally higher, degree than the collector layer 103'. The upper 101B carrier layer, if present, serves to reduce the resistance in the collector area.

In the collector layer 103' there is an area 105' with the opposite type of doping, which constitutes the base area and an area 127' which constitutes the collector contact area. In the base area 105', there is an emitter 121' and a base 125', separated by a polysilicon area 109' on the surface. There is a first contact 131' to the base 125', a second contact 133' to the emitter 121' and a third contact 135' to the collector 103'. All contacts 131', 133', 135' are only shown schematically.

The whole component is covered by an oxidized layer 107' and separated from the adjacent components by vertical bars 129' of insulating material extending through the collector area layer 103' and, if applicable, the upper carrier layer 101B. The vertical bars 129' may consist of p doped silicon, an insulator such as $SiO_2$ or a combination of different insulator materials and semiconductor materials, such as polysilicon, $SiO_2$ and $Si_3N_4$.

Figure 6:
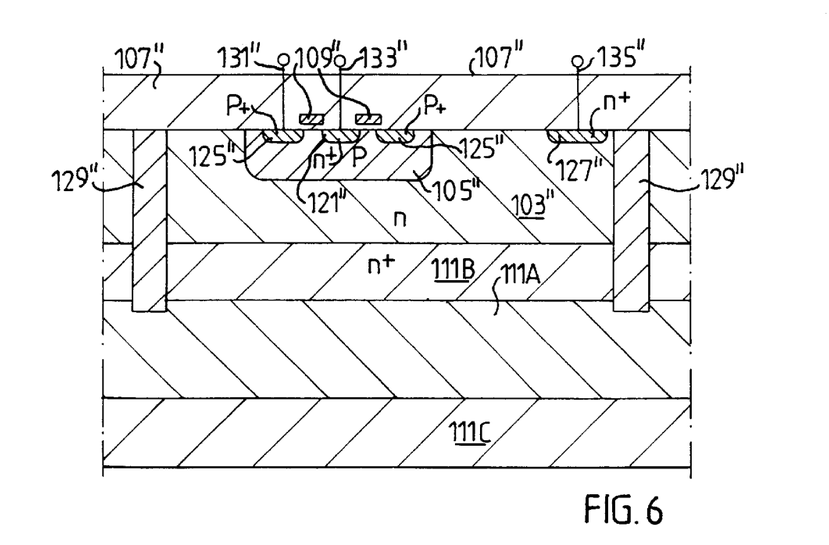
FIG. 6 is a schematic cross-sectional view of a resulting component according to yet another embodiment of the invention.

FIG. 6 is a schematic representation of cross-sectional view of a component after the final processing. The layout of the component is chosen only as an example; it could be any kind of bipolar component. This kind of component is particularly suitable when there is an underlying substrate which is not part of the component, from which the component has to be galvanically insulated, for example to reduce the leakage current or to improve the high voltage performance of the component. A lower carrier layer 111A, consists of an insulating material. An upper carrier layer 111B may be situated between the lower carrier layer 111A and the collector layer 103". If present, the upper carrier layer 111B is doped with the same type of dopant as the collector layer 103", but to a different, normally higher, degree than the collector layer 103".

The insulating carrier layer 111A rests on a substrate 111C, and is used to achieve a galvanic insulation from the substrate 111C, which may be, for example, a semiconductor, an insulator, a metal or an organo-metallic compound. If both the upper 111B, and the lower 111A carrier layers are used, the upper carrier layer 111B will reduce the resistance in the collector area 103". If the resistance in the collector area is not critical, the upper carrier layer 111B may be omitted.

In the collector layer 103" there is an area 105" with the opposite type of doping which constitutes the base area and an area 127" which constitutes the collector contact area. In the base area 105", there is an emitter 121" and a base 125", separated by a polysilicon area 109" on the surface. There is a first contact 131" to the base 125", a second contact 133" to the emitter 121" and a third contact 135" to the collector 103". All contacts 131", 133", 135" are only shown schematically.

The whole component is covered by an oxidized layer 107" and separated from the adjacent components by vertical bars 129" of insulating material extending through the collector area layer 103" and, if applicable, the upper carrier layer 111B. The vertical bars 129' may consist of p doped silicon, an insulator such as $SiO_2$ or a combination of different insulator materials and semiconductor materials, such as polysilicon, $SiO_2$ and $Si_3N_4$.

The semiconductor layers 101, 101A, 101B, 111B may consist of any kind of semiconductor, such as silicon, silicon carbide (SiC) or any element from the third or fifth row of the periodic system (III–V material). The insulating layer 111A may be, for example, $SiO_2$, $Al_2O_3$, diamond, $Si_3N_4$, quartz (crystalline $SiO_2$) or glass. The substrate 111C may be any of these.

The embodiments described above have been discussed for a ring shaped area, but it is obvious that the polysilicon areas 11', 11", 109, 109', 109" in the figures could be given any desired shape and that more than one polysilicon area could be used, depending on the type of component to be manufactured. Similarly, the doped areas 25, 41 could be two areas provided on each side of the central area 21, 11.

The order in which the emitter and the base areas are defined may also be chosen arbitrarily.

We claim:

1. A bipolar transistor comprising:
   at least an emitter and a base, said base having at least one highly doped part, said emitter and the highly doped part of the base being separated by a selectively shaped area of polycrystalline silicon, said area not being an active part of a semiconductor component;

wherein an oxide layer of substantially the same dimensions as the selectively shaped area is located between the component and the polycrystalline silicon; and wherein a nitride layer of substantially the same dimensions as the selectively shaped area is located between the oxide layer and the polycrystalline silicon.

2. A bipolar transistor comprising at least an emitter and a base, said base having at least one highly doped part, said emitter and the highly doped part of the base being separated by a selectively shaped area of polycrystalline silicon, said area not being an active part of the semiconductor component;

wherein the selectively shaped area comprises a silicide layer.

3. A bipolar transistor according to claim 1, wherein the layer of polycrystalline silicon comprises dopants of the types used in the base and in the emitter.

4. A bipolar transistor according to claim 1, comprising a carrier substrate layer comprising an insulator layer.

5. A bipolar transistor according to claim 4, wherein the insulator layer is $SiO_2$.

* * * * *